(12) United States Patent
Kleekajai et al.

(10) Patent No.: US 9,497,397 B1
(45) Date of Patent: *Nov. 15, 2016

(54) IMAGE SENSOR WITH AUTO-FOCUS AND COLOR RATIO CROSS-TALK COMPARISON

(71) Applicant: Apple Inc., Cupertino, CA (US)

(72) Inventors: Suppawan Kleekajai, Cupertino, CA (US); Xiangli Li, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/481,806

(22) Filed: Sep. 9, 2014

Related U.S. Application Data

(60) Provisional application No. 61/976,947, filed on Apr. 8, 2014.

(51) Int. Cl.
*H04N 5/359* (2011.01)
*H04N 5/369* (2011.01)
*H04N 5/232* (2006.01)
*H04N 5/365* (2011.01)

(52) U.S. Cl.
CPC .......... *H04N 5/359* (2013.01); *H04N 5/23212* (2013.01); *H04N 5/3651* (2013.01); *H04N 5/3696* (2013.01)

(58) Field of Classification Search
CPC . H04N 5/23212; H04N 5/359; H04N 5/3696
See application file for complete search history.

(56) References Cited

U.S. PATENT DOCUMENTS

| | | |
|---|---|---|
| 4,686,648 A | 8/1987 | Fossum |
| 5,105,264 A | 4/1992 | Erhardt et al. |
| 5,329,313 A | 7/1994 | Keith |
| 5,396,893 A | 3/1995 | Oberg et al. |
| 5,880,459 A | 3/1999 | Pryor et al. |
| 6,040,568 A | 3/2000 | Caulfield et al. |
| 6,233,013 B1 | 5/2001 | Hosier et al. |

(Continued)

FOREIGN PATENT DOCUMENTS

| | | |
|---|---|---|
| CN | 101189885 | 5/2008 |
| CN | 101472059 | 7/2009 |

(Continued)

OTHER PUBLICATIONS

U.S. Appl. No. 13/782,532, filed Mar. 1, 2013, Sharma et al.

(Continued)

*Primary Examiner* — Paul Berardesca
(74) *Attorney, Agent, or Firm* — Brownstein Hyatt Farber Schreck, LLP

(57) ABSTRACT

An electronic device includes an image sensor, a memory, and a processor operably connected to the image sensor and the memory. A pixel array in the image sensor includes at least one pixel that is configured as an auto-focus pixel that is at least partially shielded from light by a shielding element. The memory stores computer-readable instructions, and the processor is adapted to produce a digital image by executing the computer-readable instructions for obtaining a plurality of coefficients representing a relationship between a ratio of two affected pixels and a ratio of two non-affected pixels in the pixel array, constructing a predictive function based on the plurality of coefficients, and computing a compensated pixel value for at least one pixel of the image sensor using the predictive function. A digital image can be created based in part on the compensated pixel value.

20 Claims, 10 Drawing Sheets

(56) References Cited

U.S. PATENT DOCUMENTS

| | | |
|---|---|---|
| 6,348,929 B1 | 2/2002 | Acharya et al. |
| 6,528,833 B2 | 3/2003 | Lee et al. |
| 6,713,796 B1 | 3/2004 | Fox |
| 6,714,239 B2 | 3/2004 | Guidash |
| 6,798,453 B1 | 9/2004 | Kaifu |
| 6,816,676 B2 | 11/2004 | Bianchi et al. |
| 6,905,470 B2 | 6/2005 | Lee et al. |
| 6,982,759 B2 | 1/2006 | Goto |
| 7,091,466 B2 | 8/2006 | Bock |
| 7,119,322 B2 | 10/2006 | Hong |
| 7,259,413 B2 | 8/2007 | Rhodes |
| 7,262,401 B2 | 8/2007 | Hopper et al. |
| 7,271,835 B2 | 9/2007 | Iizuka |
| 7,282,028 B2 | 10/2007 | Kim et al. |
| 7,332,786 B2 | 2/2008 | Altice |
| 7,390,687 B2 | 6/2008 | Boettiger |
| 7,437,013 B2 | 10/2008 | Anderson |
| 7,443,421 B2 | 10/2008 | Stavely et al. |
| 7,502,054 B2 | 3/2009 | Kalapathy |
| 7,525,168 B2 | 4/2009 | Hsieh |
| 7,554,067 B2 | 6/2009 | Zarnowski et al. |
| 7,555,158 B2 | 6/2009 | Park et al. |
| 7,626,626 B2 | 12/2009 | Panicacci |
| 7,671,435 B2 | 3/2010 | Ahn |
| 7,728,351 B2 | 6/2010 | Shim |
| 7,742,090 B2 | 6/2010 | Street |
| 7,773,138 B2 | 8/2010 | Lahav et al. |
| 7,796,171 B2 | 9/2010 | Gardner |
| 7,873,236 B2 | 1/2011 | Li et al. |
| 7,880,785 B2 | 2/2011 | Gallagher |
| 7,884,402 B2 | 2/2011 | Ki |
| 7,906,826 B2 | 3/2011 | Martin et al. |
| 7,952,121 B2 | 5/2011 | Arimoto |
| 7,952,635 B2 | 5/2011 | Lauxtermann |
| 7,982,789 B2 | 7/2011 | Watanabe et al. |
| 8,026,966 B2 | 9/2011 | Altice |
| 8,032,206 B1 | 10/2011 | Farazi et al. |
| 8,089,524 B2 | 1/2012 | Urisaka |
| 8,094,232 B2 | 1/2012 | Kusaka |
| 8,140,143 B2 | 3/2012 | Picard et al. |
| 8,153,947 B2 | 4/2012 | Barbier et al. |
| 8,159,588 B2 | 4/2012 | Boemler |
| 8,174,595 B2 | 5/2012 | Honda et al. |
| 8,184,188 B2 | 5/2012 | Yaghmai |
| 8,194,148 B2 | 6/2012 | Doida |
| 8,194,165 B2 | 6/2012 | Border et al. |
| 8,227,844 B2 | 7/2012 | Adkisson |
| 8,233,071 B2 | 7/2012 | Takeda |
| 8,259,228 B2 | 9/2012 | Wei et al. |
| 8,310,577 B1 | 11/2012 | Neter |
| 8,324,553 B2 | 12/2012 | Lee |
| 8,340,407 B2 | 12/2012 | Kalman |
| 8,350,940 B2 | 1/2013 | Smith et al. |
| 8,400,546 B2 | 3/2013 | Itano et al. |
| 8,456,559 B2 | 6/2013 | Yamashita |
| 8,508,637 B2 | 8/2013 | Han et al. |
| 8,514,308 B2 | 8/2013 | Itonaga et al. |
| 8,547,388 B2 | 10/2013 | Cheng |
| 8,581,992 B2 | 11/2013 | Hamada |
| 8,619,163 B2 | 12/2013 | Ogua |
| 8,629,484 B2 | 1/2014 | Ohri et al. |
| 8,634,002 B2 | 1/2014 | Kita |
| 8,723,975 B2 | 5/2014 | Solhusvik |
| 8,754,983 B2 | 6/2014 | Sutton |
| 8,755,854 B2 | 6/2014 | Addison et al. |
| 8,767,104 B2 | 7/2014 | Makino et al. |
| 8,803,990 B2 | 8/2014 | Smith |
| 8,817,154 B2 | 8/2014 | Manabe et al. |
| 8,902,330 B2 | 12/2014 | Theuwissen |
| 8,908,073 B2 | 12/2014 | Minagawa |
| 8,934,030 B2 | 1/2015 | Kim et al. |
| 8,946,610 B2 | 2/2015 | Iwabuchi et al. |
| 8,982,237 B2 | 3/2015 | Chen |
| 9,041,837 B2 | 5/2015 | Li |
| 9,054,009 B2 | 6/2015 | Oike et al. |
| 9,066,017 B2 | 6/2015 | Geiss |
| 9,066,660 B2 | 6/2015 | Watson et al. |
| 9,088,727 B2 | 7/2015 | Trumbo |
| 9,094,623 B2 | 7/2015 | Kawaguchi |
| 9,099,604 B2 | 8/2015 | Roy |
| 9,100,597 B2 | 8/2015 | Hu |
| 9,131,171 B2 | 9/2015 | Aoki et al. |
| 2003/0036685 A1 | 2/2003 | Goodman et al. |
| 2004/0207836 A1 | 10/2004 | Chhibber et al. |
| 2006/0274161 A1 | 12/2006 | Ing et al. |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0128671 A1* | 5/2009 | Kusaka ............... H04N 5/23212 348/246 |
| 2009/0201400 A1 | 8/2009 | Zhang et al. |
| 2010/0134631 A1 | 6/2010 | Voth |
| 2011/0028802 A1 | 2/2011 | Addison et al. |
| 2011/0069210 A1* | 3/2011 | Ogura ..................... H04N 5/359 348/247 |
| 2011/0077531 A1 | 3/2011 | Watson et al. |
| 2011/0080500 A1 | 4/2011 | Wang et al. |
| 2011/0156197 A1 | 6/2011 | Tivarus et al. |
| 2011/0245690 A1 | 10/2011 | Watson et al. |
| 2012/0092541 A1 | 4/2012 | Tuulos et al. |
| 2012/0098964 A1 | 4/2012 | Oggier et al. |
| 2012/0105688 A1* | 5/2012 | Kita ........................ H04N 5/359 348/242 |
| 2013/0135500 A1* | 5/2013 | Theuwissen ......... H04N 5/2173 348/242 |
| 2013/0147981 A1 | 6/2013 | Wu |
| 2013/0155271 A1* | 6/2013 | Ishii ................... H04N 5/23212 348/222.1 |
| 2013/0222584 A1 | 8/2013 | Aoki et al. |
| 2014/0049683 A1 | 2/2014 | Guenter |
| 2014/0071321 A1 | 3/2014 | Seyama |
| 2014/0240550 A1* | 8/2014 | Taniguchi ............... H04N 5/217 348/239 |
| 2014/0246568 A1 | 9/2014 | Wan |
| 2014/0247378 A1 | 9/2014 | Sharma et al. |
| 2014/0252201 A1 | 9/2014 | Li et al. |
| 2014/0253754 A1 | 9/2014 | Papiashvili |
| 2014/0263951 A1 | 9/2014 | Fan et al. |
| 2014/0267855 A1 | 9/2014 | Fan |
| 2014/0347533 A1* | 11/2014 | Toyoda ................... H04N 9/045 348/294 |
| 2014/0354861 A1 | 12/2014 | Pang |
| 2015/0163392 A1 | 6/2015 | Malone et al. |
| 2015/0163422 A1 | 6/2015 | Fan et al. |
| 2015/0237314 A1 | 8/2015 | Hasegawa |
| 2015/0264241 A1 | 9/2015 | Kleekajai et al. |
| 2015/0264278 A1 | 9/2015 | Kleekajai et al. |
| 2015/0312479 A1 | 10/2015 | McMahon et al. |
| 2015/0350575 A1 | 12/2015 | Agranov et al. |

FOREIGN PATENT DOCUMENTS

| | | |
|---|---|---|
| CN | 101567977 | 10/2009 |
| CN | 101622859 | 1/2010 |
| CN | 101803925 | 8/2010 |
| EP | 2023611 | 2/2009 |
| EP | 2107610 | 10/2009 |
| EP | 2230690 | 9/2010 |
| JP | 2000059697 | 2/2000 |
| JP | 2001211455 | 8/2001 |
| JP | 2009021809 | 1/2009 |
| JP | 2009159186 | 7/2009 |
| JP | 201149697 | 3/2011 |
| JP | 2011097646 | 12/2011 |
| JP | 2013070240 | 4/2013 |
| JP | 2013529035 | 7/2013 |
| KR | 20030034424 | 5/2003 |
| KR | 20030061157 | 7/2003 |
| KR | 2008/069851 | 7/2008 |
| KR | 20100008239 | 1/2010 |
| KR | 20100065084 | 6/2010 |
| KR | 20130074459 | 7/2013 |

(56) References Cited

FOREIGN PATENT DOCUMENTS

| TW | 201301881 | 1/2013 |
|---|---|---|
| WO | WO 2010/120945 | 10/2010 |
| WO | WO 2012/053363 | 4/2012 |
| WO | WO 2012/088338 | 6/2012 |
| WO | WO 2012/122572 | 9/2012 |
| WO | WO 2013/008425 | 1/2013 |
| WO | WO 2013/179018 | 12/2013 |
| WO | WO 2013/179020 | 12/2013 |

OTHER PUBLICATIONS

U.S. Appl. No. 13/783,536, filed Mar. 4, 2013, Wan.
U.S. Appl. No. 13/785,070, filed Mar. 5, 2013, Li.
U.S. Appl. No. 13/787,094, filed Mar. 6, 2013, Li et al.
U.S. Appl. No. 13/797,851, filed Mar. 12, 2013, Li.
U.S. Appl. No. 13/830,748, filed Mar. 14, 2013, Fan.
U.S. Appl. No. 14/098,504, filed Dec. 5, 2013, Fan et al.
U.S. Appl. No. 14/207,150, filed Mar. 12, 2014, Kleekajai et al.
U.S. Appl. No. 14/207,176, filed Mar. 12, 2014, Kleekajai et al.
U.S. Appl. No. 14/276,728, filed May 13, 2014, McMahon et al.
U.S. Appl. No. 14/292,599, filed May 30, 2014, Agranov et al.
U.S. Appl. No. 14/462,032, filed Aug. 18, 2014, Jiang et al.
U.S. Appl. No. 14/481,820, filed Sep. 9, 2014, Lin et al.
U.S. Appl. No. 14/501,429, filed Sep. 30, 2014, Malone et al.
U.S. Appl. No. 14/503,322, filed Sep. 30, 2014, Molgaard.
U.S. Appl. No. 14/569,346, filed Dec. 12, 2014, Kestelli et al.
U.S. Appl. No. 14/611,917, filed Feb. 2, 2015, Lee et al.
Aoki, et al., "Rolling-Shutter Distortion-Free 3D Stacked Image Sensor with -160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.
Elgendi, "On the Analysis of Fingertip Photoplethysmogram Signals," *Current Cardiology Reviews,* 2012, vol. 8, pp. 14-25.
Feng, et al., "On the Stoney Formula for a Thin Film/Substrate System with Nonuniform Substrate Thickness," *Journal of Applied Mechanics,* Transactions of the ASME, vol. 74, Nov. 2007, pp. 1276-1281.
Fu, et al., "Heart Rate Extraction from Photoplethysmogram Waveform Using Wavelet Multui-resolution Analysis," *Journal of Medical and Biological Engineering,* 2008, vol. 28, No. 4, pp. 229-232.
Han, et al., "Artifacts in wearable photoplethysmographs during daily life motions and their reduction with least mean square based active noise cancellation method," *Computers in Biology and Medicine,* 2012, vol. 42, pp. 387-393.
Lopez-Silva, et al., "Heuristic Algorithm for Photoplethysmographic Heart Rate Tracking During Maximal Exercise Test," *Journal of Medical and Biological Engineering,* 2011, vol. 12, No. 3, pp. 181-188.
Santos, et al., "Accelerometer-assisted PPG Measurement During Physical Exercise Using the LAVIMO Sensor System," *Acta Polytechnica,* 2012, vol. 52, No. 5, pp. 80-85.
Sarkar, et al., "Fingertip Pulse Wave (PPG signal) Analysis and Heart Rate Detection," *International Journal of Emerging Technology and Advanced Engineering,* 2012, vol. 2, No. 9, pp. 404-407.
Schwarzer, et al., On the determination of film stress from substrate bending: STONEY'S formula and its limits, Jan. 2006, 19 pages.
Yan, et al., "Reduction of motion artifact in pulse oximetry by smoothed pseudo Wigner-Ville distribution," *Journal of NeuroEngineering and Rehabilitation,* 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep. 2012, pp. 2004-2008.

\* cited by examiner

SECTION 3-3

IMAGE SENSOR WITH AUTO-FOCUS AND COLOR RATIO CROSS-TALK COMPARISON

CROSS-REFERENCE TO RELATED APPLICATION

This application claims the benefit under 35 U.S.C. §119(e) of U.S. Provisional Patent Application No. 61/976,947, filed Apr. 8, 2014, entitled "Image Sensor with Auto-Focus and Color Ratio Cross-Talk Comparison," which is incorporated by reference as if fully disclosed herein.

TECHNICAL FIELD

The present invention relates generally to an image sensor and more specifically to an image sensor having pixel cross-talk compensation to reduce the effects of optically interfering elements integrated into the image sensor.

BACKGROUND

Portable digital cameras can be used to record digital images or digital video of a physical scene. A digital camera or image-recording device typically includes an image sensor formed from an array of sensor cells or sensor regions otherwise referred to as pixels. Each pixel is configured collect light from the physical scene and produce an electronic signal in response to the amount of light incident on the pixel. The signals from the array pixels may be scanned and stored as pixel data. The pixel data can be used to create a digital image that represents a visual depiction of the physical scene.

Many digital cameras also include optical components that are configured to focus the light on the surface of the image sensor. The optical components may be mechanically adjustable in order to focus light from objects that may be a variable distance from the digital camera. In some cases, the image sensor may also include auto-focus elements that are integrated into the array of sensor cells or pixels and used to determine if the light is sufficiently focused on the image sensor. In some cases, auto-focus elements that are integrated into the sensor provide feedback to an auto-focus mechanism that adjusts one or more optical components of the digital camera.

One potential drawback to using auto-focus elements that are integrated within the array of pixels is that the elements may cause cross-talk between adjacent pixels. In particular, the auto-focus elements may interfere with the light received by image sensor causing an inaccurate light reading for some pixels that are adjacent or near the auto-focus elements. That is, the auto-focus elements may cause more or less light to be absorbed by some of the pixels in the array. Due to variations in the amount of light received by the neighboring pixels, in some cases, the use of auto-focus elements results in a digital image that is less accurate or contains artifacts due to the optical interference.

SUMMARY

The system and techniques described herein can be used to reduce cross talk between adjacent pixels in an image sensor array. More specifically, the system and techniques can be used to reduce the effects of interference caused by the use of shielding elements, which may improve the accuracy and quality of a resulting digital image.

In one aspect, an electronic device includes an image sensor, a memory, and a processor operably connected to the image sensor and the memory. A pixel array in the image sensor includes at least one pixel that is configured as an auto-focus pixel that is at least partially shielded from light by a shielding element. The memory stores computer-readable instructions, and the processor is adapted to produce a digital image by executing the computer-readable instructions for obtaining a plurality of coefficients representing a relationship between a ratio of two affected pixels and a ratio of two non-affected pixels in the pixel array, constructing a predictive function based on the plurality of coefficients, and computing a compensated pixel value for at least one pixel of the image sensor using the predictive function. A digital image can be created based in part on the compensated pixel value. The computer-readable instructions may compensate for cross-talk between adjacent pixels and reduce the effect of the shielding elements integrated into the pixel array. As one example, the predictive function is a polynomial function. In particular, the predictive function may be a sixth-order polynomial function. The predictive function may be constructed, for example, by performing a non-linear regression on at least part of the coefficients.

In one embodiment, the affected pixels are located adjacent to an auto-focus pixel that is at least partially shielded from light by a shielding element, while the non-affected pixels are not adjacent to an auto-focus pixel.

In another aspect, a computer-implemented method for producing a digital image using an image sensor comprised of a pixel array can include obtaining a plurality of coefficients representing a relationship between a ratio of two affected pixels and a ratio of two non-affected pixels in the pixel array, and constructing a predictive function based on the plurality of coefficients. A compensated pixel value for at least one pixel of the image sensor can be determined using the predictive function. A digital image can then be created based in part on the compensated value.

In yet another aspect, a computer-implemented method for calibrating an image sensor to compensate for an effect of shielding elements integrated into a pixel array of an image sensor can include illuminating the image sensor using a light source, acquiring pixel data for a pixel array of the image sensor, and determining a plurality of coefficients that represents a relationship between a ratio of two affected pixels and a ratio of two non-affected pixels in the pixel array. A predictive function based on the plurality of coefficients can then be constructed.

BRIEF DESCRIPTION OF THE DRAWINGS

Embodiments of the invention are better understood with reference to the following drawings. The elements of the drawings are not necessarily to scale relative to each other. Identical reference numerals have been used, where possible, to designate identical features that are common to the figures.

DETAILED DESCRIPTION

The embodiments described herein are directed to a digital camera used to create a digital image or digital video. In the examples provided below, the digital camera includes an image sensor formed from an array of photosensitive elements or pixels. The image sensor may include a charge-coupled device (CCD) image sensor, a complementary metal-oxide-semiconductor (CMOS) image sensor, or other type of imaging sensor device. Each pixel of the image sensor may be configured to produce an electrical signal in response to light incident to a corresponding portion of the surface of the image sensor. The electrical signals can be converted into a digital data format and used to create a digital image or video sequence.

In one example, the digital camera includes one or more elements integrated with the pixel array. The elements may include shielding elements that can be used to provide feedback to an auto-focus system configured to focus the light onto the image sensor. As previously mentioned, the presence of shielding elements may interfere with the light incident to at least some of the pixels in the array, which may result reduce the accuracy of the pixels and potentially reduce the quality of a digital image produced using the sensor.

The system and techniques described herein can be used to reduce or eliminate auto-focus pixel cross-talk artifacts caused by one or more elements integrated into the pixel array. In particular, the amount of auto-focus pixel cross-talk artifacts may be quantified as an increase or decrease of light due to optically interfering elements in the pixel array. The amount of auto-focus pixel cross-talk artifacts may be estimated and a compensation can be applied to the affected pixel based on the estimation. A different degree of compensation may be applied to different pixels in the array depending on the spatial relationship of the pixel with respect to the optically interfering element. By applying cross-talk compensation across the pixel array of the image sensor, the techniques described herein can be used to create a digital image that reduces or minimizes effects due to auto-focus pixel cross-talk.

Figure 1B:
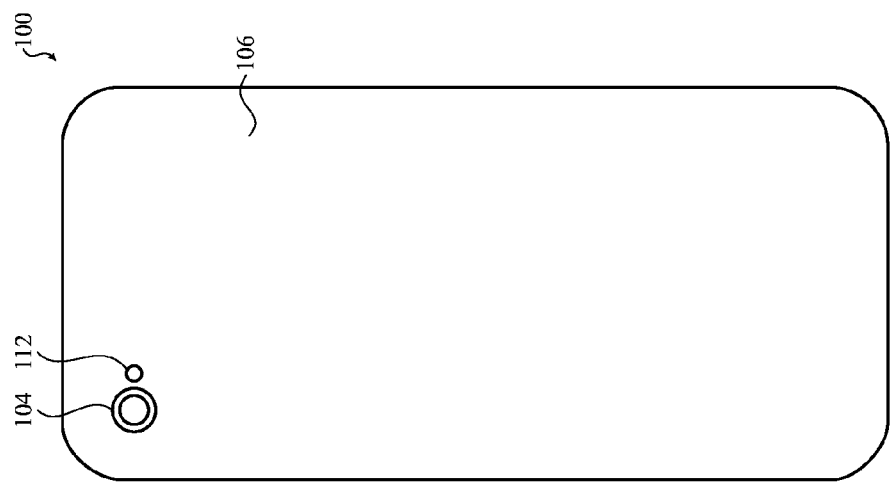
FIG. 1B illustrates a rear view of an electronic device having one or more cameras.
Figure 1A:
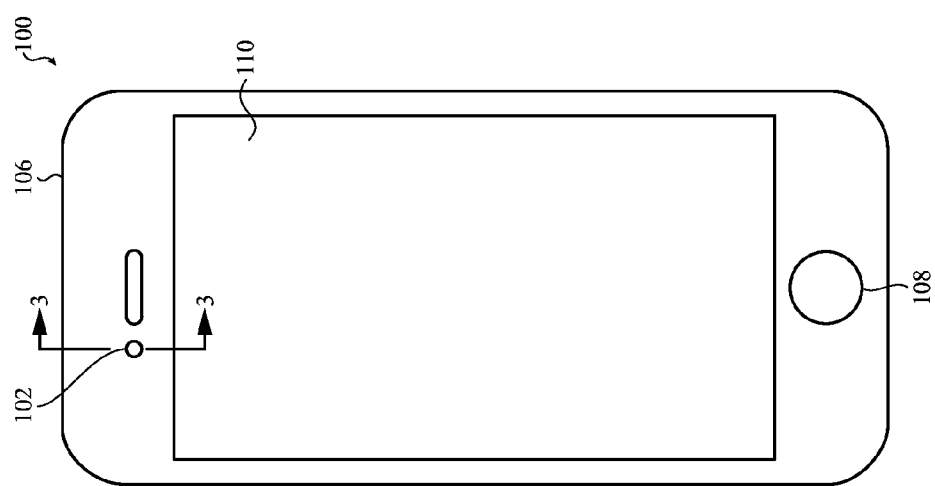
FIG. 1A depicts a front view of an electronic device having one or more cameras.

FIGS. 1A-1B depict a front and rear view of an electronic device that includes one or more cameras. The electronic device 100 includes a first camera 102, a second camera 104, an enclosure 106, a display 110, an input/output (I/O) member 108, and a flash 112 or light source for the camera or cameras. The electronic device 100 also includes one or more internal components typical of a computing or electronic device, such as, for example, one or more processors, memory components, network interfaces, and so on. An example schematic diagram of some of the internal components of device 100 is described below with respect to FIG. 2.

In the example depicted in FIGS. 1A-B, the electronic device 100 is a mobile telephone. Other embodiments, however, are not limited to this construction. Other types of electronic devices such as, for example, a laptop computer, a tablet computer, a digital camera, a printer, a scanner, a video recorder, a copier, or a wearable computing or communications device can include one or more cameras.

As shown in FIGS. 1A-B, the enclosure 106 can form an outer surface or partial outer surface and protective case for the internal components of the electronic device 100, and may at least partially surround the display 110. The enclosure 106 can be formed of one or more components operably connected together, such as a front piece and a back piece. Alternatively, the enclosure 106 can be formed of a single piece operably connected to the display 110.

The I/O member 108 can be implemented with any type of input or output member. By way of example only, the I/O member 108 can be a switch, a button, a capacitive sensor, or other input mechanism. The I/O member 108 allows a user to interact with the electronic device 100. For example, the I/O member 108 may be a button or switch to alter the volume, return to a home screen, and the like. The electronic device can include one or more input members or output members, and each member can have a single I/O function or multiple I/O functions.

The display 110 can be operably or communicatively connected to the electronic device 100. The display 110 may be used to display digital images, digital video sequences, or other visual media. The display 110 can be implemented with any type of suitable display, such as a retina display or an active matrix color liquid crystal display. The display 110 can provide a visual output for the electronic device 100 or function to receive user inputs to the electronic device. For example, the display 110 can be a multi-touch capacitive sensing touchscreen that can detect one or more user inputs.

Figure 2:
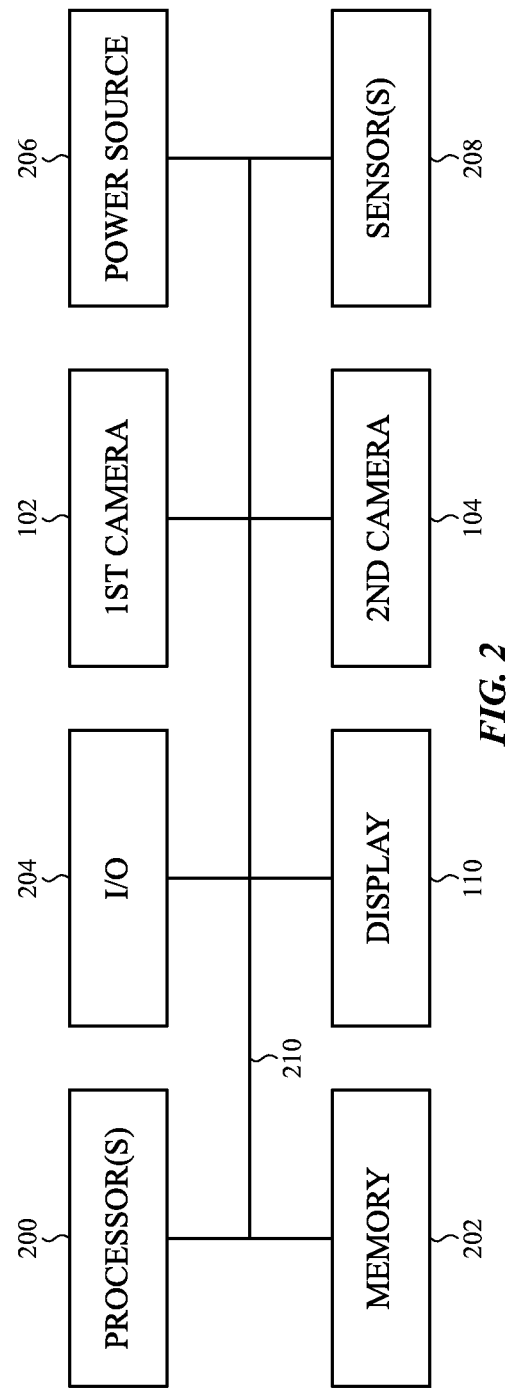
FIG. 2 depicts an example block diagram of the electronic device 100 shown in FIGS. 1A-1B.

The electronic device 100 may also include a number of internal components. FIG. 2 depicts an example block diagram of the electronic device 100. The electronic device can include one or more processors 200, storage or memory components 202, input/output interface 204, power source 206, and sensors 208, each of which will be discussed in turn below.

The one or more processors 200 are configured to execute computer-readable instructions and can control some or all of the operations of the electronic device 100. The processor(s) 200 can communicate, either directly or indirectly, with many of the components of the electronic device 100. For example, one or more system buses 210 or other communication mechanisms can provide communication between the processor(s) 200, the cameras 102, 104, the display 110, the I/O member 108, or the sensors 208. The processor(s) 200 can be implemented as any electronic device capable of processing, receiving, or transmitting data or instructions. For example, the one or more processors 200 can be a microprocessor, a central processing unit (CPU), an application-specific integrated circuit (ASIC), a digital signal processor (DSP), or combinations of multiple such devices. As described herein, the term "processor" is meant to encompass a single processor or processing unit, multiple processors, multiple processing units, or other suitably configured computing element or elements.

The memory 202 can store electronic data that can be used by the electronic device 100. For example, the memory 202 can store electrical data or content such as, for example, digital image files, digital video files, audio files, document files, timing signals, and other digital data. The memory 202 can be configured as any type of memory. By way of example only, memory 202 can be implemented as random access memory, read-only memory, flash memory, removable memory, or other types of storage elements, in any combination.

One or more input/output interfaces 204 can receive data from a user or one or more other electronic devices. Additionally, the input/output interface 204 can facilitate transmission of data to a user or to other electronic devices. For example, in embodiments where the electronic device 100 is a smart telephone, the input/output interface 204 can receive data from a network or send and transmit electronic signals via a wireless or wired connection. Examples of wireless and wired connections include, but are not limited to, cellular, WiFi, Bluetooth, and Ethernet. In one or more embodiments, the input/output interface 204 supports multiple network or communication mechanisms. For example, the input/output interface 204 can pair with another device over a Bluetooth network to transfer signals to the other device while simultaneously receiving signals from a WiFi or other wired or wireless connection.

The power source 206 can be implemented with any device capable of providing energy to the electronic device 100. For example, the power source 206 can be a battery or a connection cable that connects the electronic device 100 to another power source such as a wall outlet.

The one or more sensors 208 can by implemented with any type of sensors. Examples of sensors include, but are not limited to, audio sensors (e.g., microphones), light sensors (e.g., ambient light sensors), gyroscopes, and accelerometers. The sensors 208 can be used to provide data to the processor 200, which may be used to enhance or vary functions of the electronic device.

Figure 3:
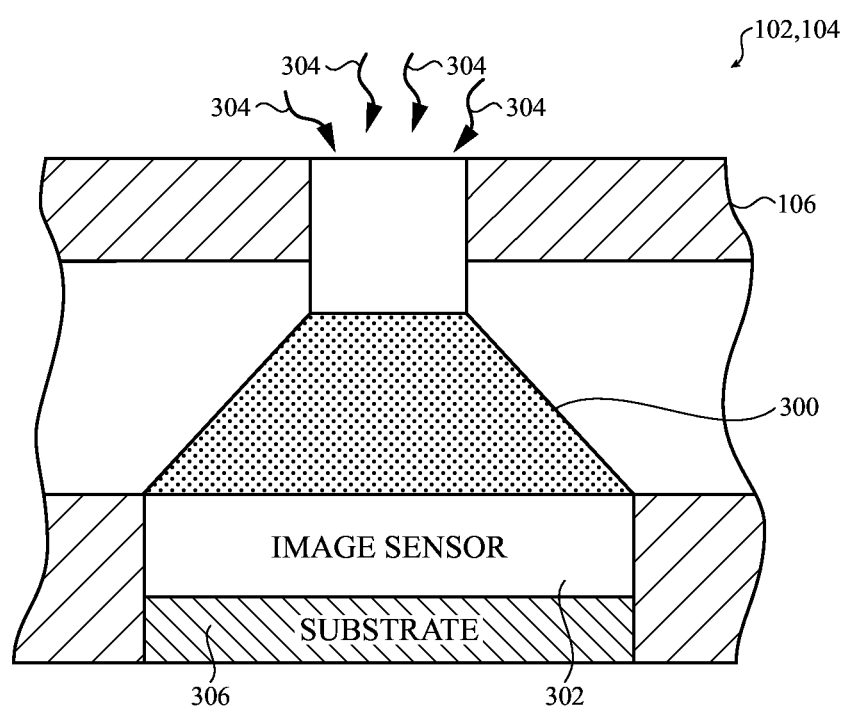
FIG. 3 illustrates a cross-sectional view of a digital camera taken along line 3-3 in FIG. 1A.

As described with reference to FIGS. 1A and 1B, the electronic device 100 includes one or more cameras 102, 104 and optionally a flash 112 or light source for the camera or cameras. FIG. 3 depicts a cross-sectional view of the camera 102 taken along line 3-3 in FIG. 1A. Although FIG. 3 illustrates the first camera 102, those skilled in the art will recognize that the second camera 104 can be substantially similar to the first camera 102. In some embodiments, one camera may include a global shutter configured image sensor and one camera can include a rolling shutter configured image sensor. In other examples, one camera can include an image sensor with a higher resolution than the image sensor in the other camera.

The cameras 102, 104 include an imaging stage 300 that is in optical communication with an image sensor 302. The imaging stage 300 is operably connected to the enclosure 106 and positioned in front of the image sensor 302. The imaging stage 300 can include optical elements such as a lens, a filter, an iris, and a shutter. The imaging stage 300 directs, focuses or transmits light 304 within its field of view onto the image sensor 302. The image sensor 302 captures one or more images of a subject scene by converting the incident light into electrical signals.

The image sensor 302 is supported by a support structure 306. The support structure 306 can be a semiconductor-based material including, but not limited to, silicon, silicon-on-insulator (SOI) technology, silicon-on-sapphire (SOS) technology, doped and undoped semiconductors, epitaxial layers formed on a semiconductor substrate, well regions or buried layers formed in a semiconductor substrate, and other semiconductor structures.

Various elements of imaging stage 300 or image sensor 302 can be controlled by timing signals or other signals supplied from a processor or memory, such as processor 200 in FIG. 2. Some or all of the elements in the imaging stage 300 can be integrated into a single component. Additionally, some or all of the elements in the imaging stage 300 can be integrated with image sensor 302, and possibly one or more additional elements of electronic device 100, to form a camera module. For example, a processor or a memory may be integrated with the image sensor 302 in embodiments.

Figure 4:
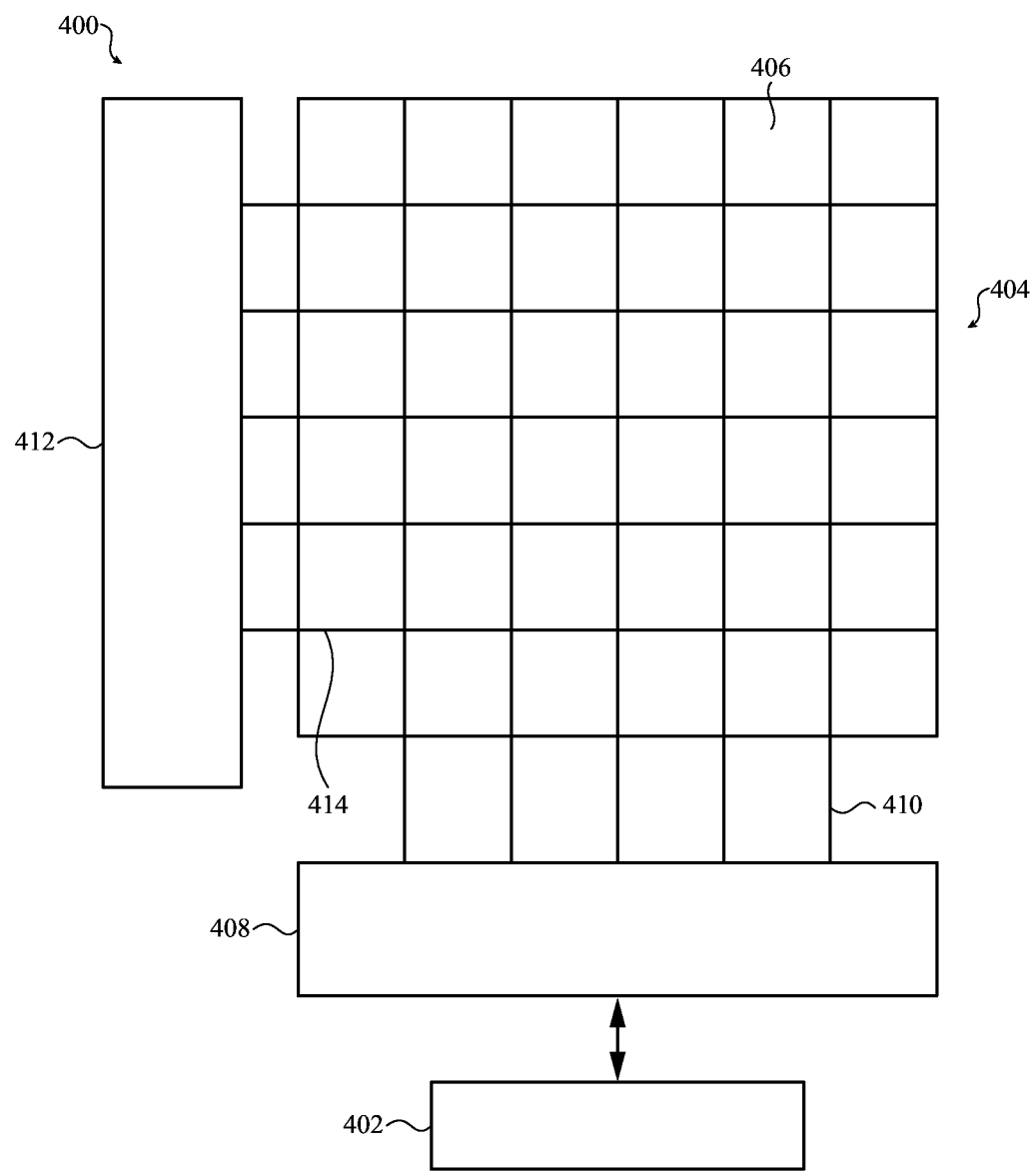
FIG. 4 depicts a schematic representation of an image sensor.

Referring now to FIG. 4, there is shown a top view of one example of an image sensor suitable for use as image sensor (e.g., FIG. 3, item 302) in some embodiments. In this example, the image sensor 400 includes an image processor 402 and an imaging area 404. The imaging area 404 is implemented as a pixel array that includes pixels 406. In the illustrated embodiment, the pixel array is configured as a two-dimensional array in a row and column arrangement. However, other embodiments are not limited to this configuration. The pixels in a pixel array can be arranged in any suitable configuration, such as, for example, a hexagon configuration.

The imaging area 404 may be in communication with a column select 408 through one or more column select lines 410 and a row select 412 through one or more row select lines 414. The row select 412 selectively activates a particular pixel 406 or group of pixels, such as all of the pixels 406 in a certain row. The column select 408 selectively receives the data output from the select pixels 406 or groups of pixels (e.g., all of the pixels with a particular column).

The row select 412 and/or the column select 408 may be in communication with an image processor 402. The image processor 402 may trigger a pixel scan to obtain the pixel values of the pixel array over a relatively short scan time. The pixel scan may be performed, for example, in response to a user input or a request by an operation being performed on the device. By performing a pixel scan, the image processor 402 can process data from the pixels 406 and provide that data to the processor (e.g., FIG. 2, item 200) and/or other components of the electronic device (e.g., FIGS. 1-2, item 100). It should be noted that in some embodiments, the image processor 402 can be incorporated into the processor (FIG. 2, item 200) or separate therefrom.

An image sensor can be constructed on a single semiconductor-based wafer or on multiple semiconductor-based wafers to form an array of photodetectors. In general, photodetectors detect light with little or no wavelength specificity, making it difficult to identify or separate colors. When color separation is desired, a color filter array can be disposed over the imaging area to filter the wavelengths of light sensed by the photodetectors in the imaging area. A color filter array is a mosaic of filter elements with each filter element typically disposed over a respective pixel. A filter element restricts the wavelengths of light detected by the photodetector, which permits color information in a captured image to be separated and identified.

Figure 5:
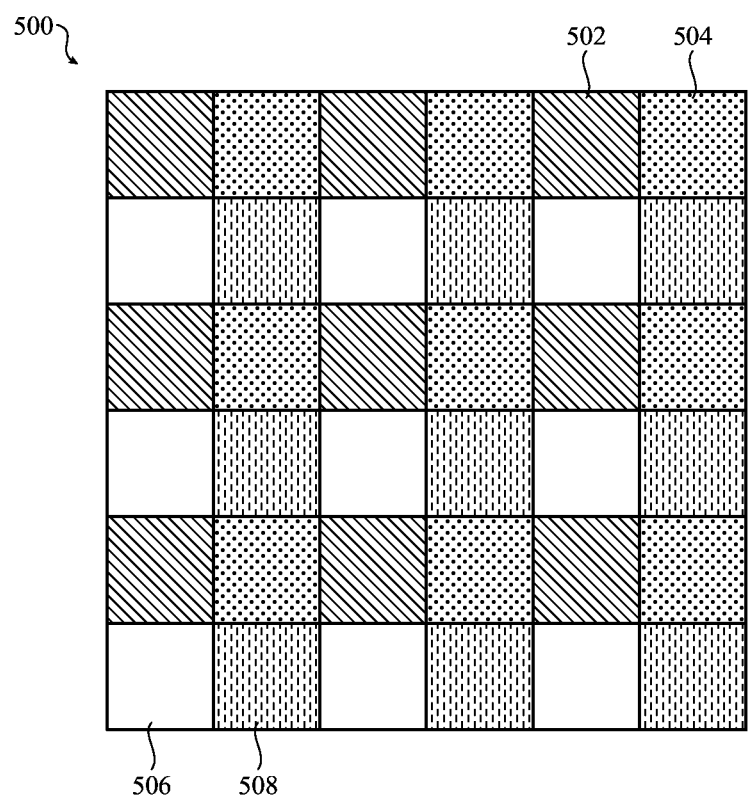
FIG. 5 illustrates an example color filter array that can be implemented in an image sensor.

FIG. 5 depicts an example color filter array that can be implemented in an image sensor. As shown in FIG. 5, the color filter array (CFA) 500 includes filter elements 502, 504, 506, 508. Although only a limited number of filter elements are shown, those skilled in the art will recognize that a color filter can include thousands or millions of filter elements.

In one embodiment, the filter elements transmit a given range of light wavelengths. In another embodiment, some of the filter elements filter light wavelengths while other filter elements are panchromatic. A panchromatic color filter can have a wider spectral sensitivity than the spectral sensitivities of the other color filters in the CFA. For example, a panchromatic filter can have a high sensitivity across the entire visible spectrum. A panchromatic filter can be implemented, for example, as a neutral density filter or a color filter. Panchromatic filters can be suitable in low level lighting conditions, where the low level lighting conditions can be the result of low scene lighting, short exposure time, small aperture, or other situations where light is restricted from reaching the image sensor.

Color filter arrays can be configured in a number of different mosaics. The color filter array 500 can be implemented as a red (R), green (G), and blue (B) color filter array or a cyan (C), magenta (M), yellow (Y) color filter array. The Bayer pattern is a well know color filter array pattern. The Bayer color filter array filters light in the red (R), green (G), and blue (B) wavelengths ranges. The Bayer color filter pattern includes two green color filters (Gr and Gb), one red color filter, and one blue color filter. The group of four color filters is tiled or repeated over the pixels in an imaging area to form the color filter array. For purposes of the following discussion, an image pixel may refer to the sensor region associated with a single color of the color filter array. However, in alternative implementations, a pixel may refer to a sensor region that includes multiple colors of the color filter array.

As previously mentioned, the image sensor may also include one or more elements to facilitate auto-focus functionality. In one example, shielding elements are used to provide feedback for an auto-focus mechanism configured to focus light onto the surface of the image sensor.

Figure 6:
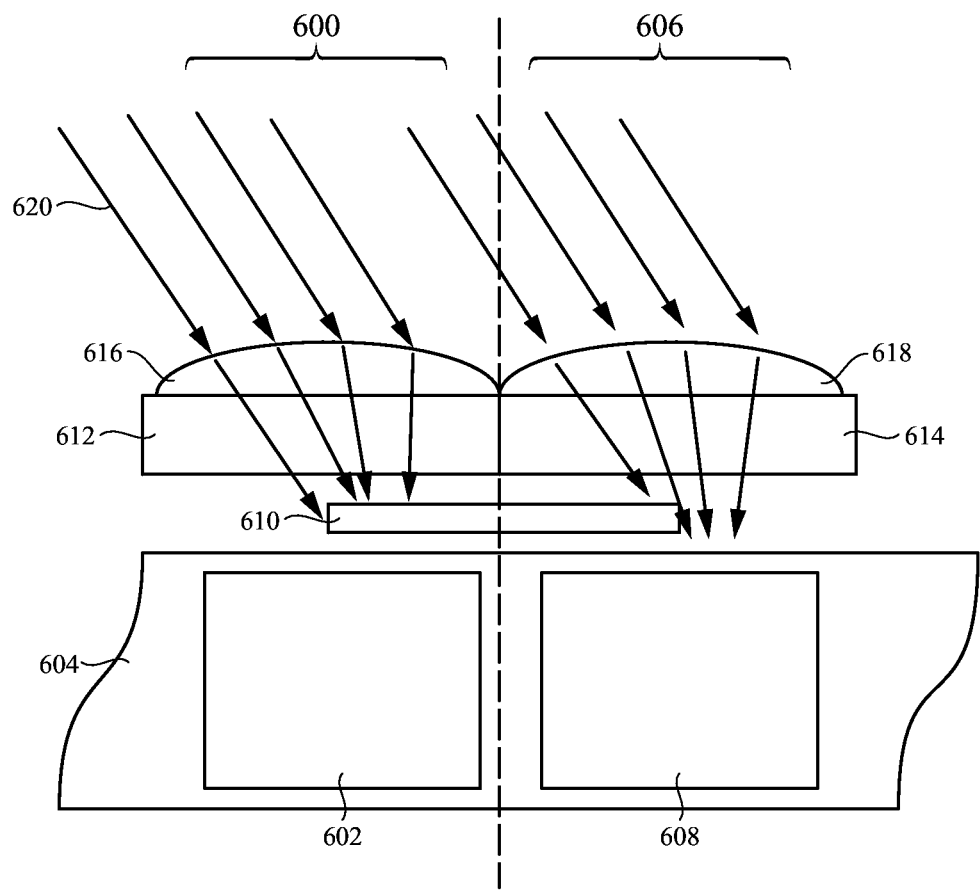
FIG. 6 depicts a side view of two adjacent auto-focus pixels in an embodiment.

FIG. 6 depicts a simplified cross-sectional view of a pair of auto-focus (AF) pixels. A first pixel 600 includes a photodetector 602 formed in a substrate 604. The substrate can be a semiconductor-based material similar to those described in conjunction with the support structure 306 in FIG. 3. A second pixel 606 includes a photodetector 608 formed in the substrate 604. A shielding element 610 is disposed over portions of both of the photodetectors 602, 608. The shielding element 610 can be made of any opaque material or combination of materials, including, but not limited to, a metal.

As shown in FIG. 6, the shielding element 610 is disposed over contiguous portions of the photodetectors. Other embodiments are not limited to this construction. The shielding element 610 can cover different non-contiguous portions of the photodetectors. The shielding element can be disposed over any given portion of the photodetectors. For example, the shielding element can be disposed over half of each photodetector. In some cases, the shielding element only partially covers a single AF pixel and the other adjacent pixels are substantially not covered by the shielding element.

Filter elements 612, 614 are disposed over the photodetectors 602, 608, respectively. The filter elements 612, 614 can filter light wavelengths that represent the same or different colors. A microlens 616, 618 is disposed over each filter element 612, 614. The microlenses 616, 618 are configured to focus incident light 620 onto respective photodetectors 602, 608. The light 620 is angled from the left in the illustrated embodiment. The shielding element 610 blocks some or all of the light 620 received by the pixel 600, thereby preventing the photodetector 602 from detecting all of the light that would be incident on the photodetector 602 if the shielding element were not present. Similarly, the shielding element 610 blocks some or all of the light 620 received by the pixel 606, thereby preventing the photodetector 608 from detecting all of the light that would be incident on the photodetector 608 if the shielding element were not present. Due to the direction and angle of the light 620 and the shielding element 610, the photodetector 608 can detect more light 620 than the photodetector 602. Thus, the photodetector 608 can accumulate more charge than the photodetector 602, making the signal response of the pixel 606 higher than the signal response of the pixel 600.

When the light 620 is angled from the right (not shown), the signal response of the pixel 600 can be higher than the signal response of the pixel 606. And when the light is perpendicular to the surface of the substrate 604, partial light will be blocked on both pixels 600, 606, and the signal responses of both pixels 600, 606 can be substantially the same. Object phase information can be obtained by analyzing the signal responses of the pixels in the asymmetrical pair. The object phase information can be used to provide information about the field depth.

Figure 7:
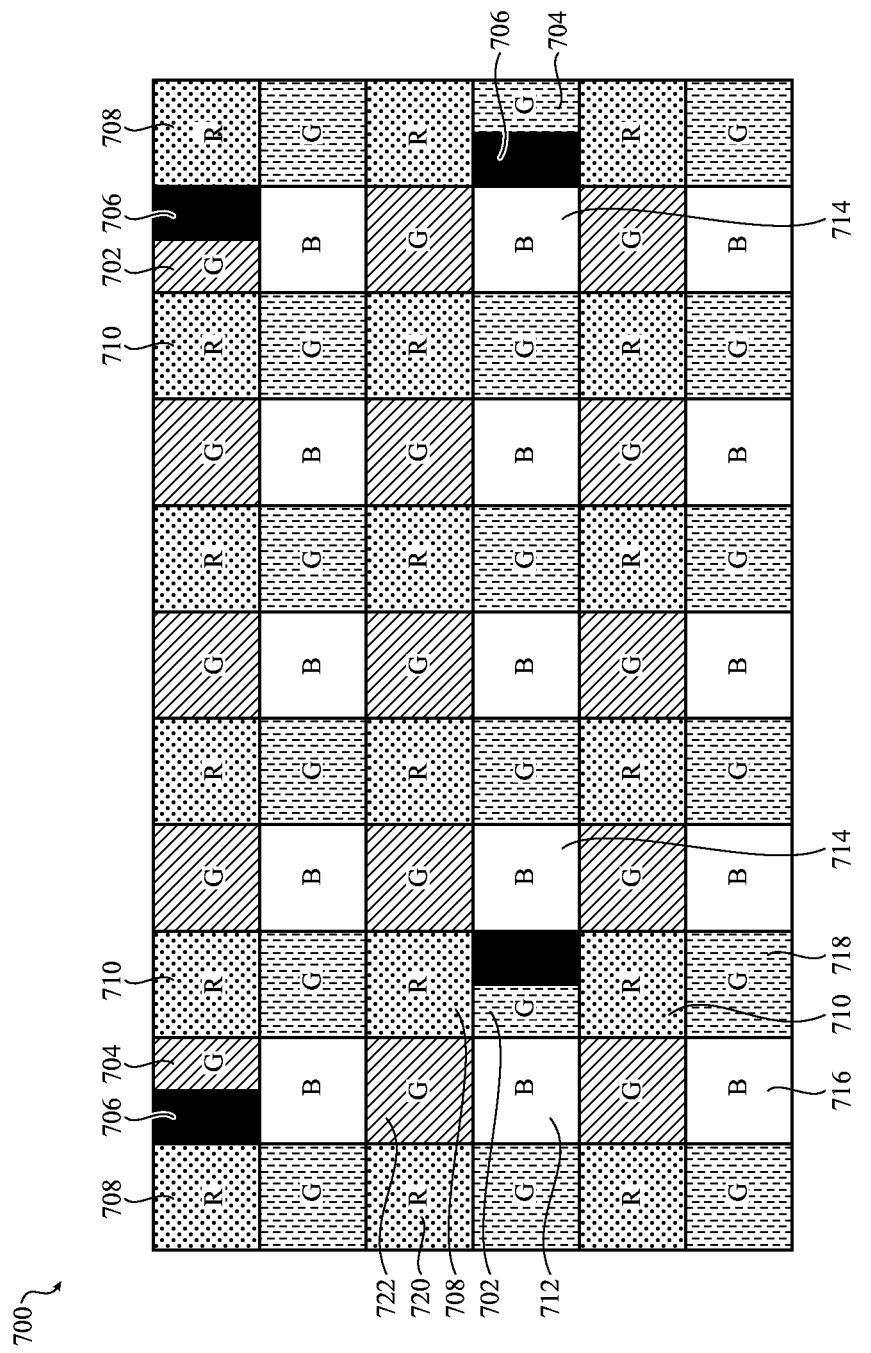
FIG. 7 illustrates an image sensor with shielding elements integrated into the array of sensor pixels.

FIG. 7 depicts an image sensor with shielding elements integrated into the array of sensor pixels. As indicated by the shading shown in FIG. 7, each pixel of the pixel array is associated with a filter element of a CFA. As discussed above with respect to FIG. 5, the CFA may correspond to a Bayer color filter array, which typically includes two green color filters (Gr and Gb), one red color filter, and one blue color filter. The group of four color filters is tiled or repeated over the pixels in an imaging area to form the color filter array.

As shown in FIG. 7, the image sensor 700 also includes multiple auto-focus pixels (AF pixels 702, 704), with each AF pixel having a shielding element 706. In this example, the image sensor 700 includes right-shield AF pixels 702 having a shielding element 706 located over the right side of the pixel. Similarly, the image sensor 700 includes left-shield AF pixels 704 having a shielding element 706 located over the left side of the pixel. In an alternative embodiment, the AF pixels may have shielding elements that are located in different positions with respect to the AF pixels, such as over the top or over the bottom of the AF pixels. As described above with respect to FIG. 6, using AF pixels that have shielding elements in different locations facilitates auto-focus measurements that can be used as feedback for an auto-focus mechanism that adjusts one or more optical components of the digital camera.

As shown in FIG. 7, within the image sensor 700, there are multiple pixels that are adjacent to the AF pixels (702, 704) that may be affected by the presence of the shielding elements 706. As discussed previously, pixels that are adjacent to an AF pixel may exhibit an AF pixel cross-talk effect due to the presence of the shielding element interfering with light incident on the surface of the image sensor. By way of example, FIG. 7 depicts an AF pixel 702 having four adjacent pixels 708, 710, 712, 714. Due to the proximity of the adjacent pixels 708, 710, 712, 714 to the AF pixel 702, one or more of the adjacent pixels 708, 710, 712, 714 may be affected by the presence of the shielding element 706.

As described in more detail below with respect to FIGS. 8-10, the effect of the shielding element 706 can be reduced or eliminated by correcting the pixel output of an affected pixel adjacent to an AF pixel based on a ratio of the pixel outputs of two non-affected pixels. In one example, the pixel output of one affected pixel of a first color adjacent to an AF pixel is corrected based on a ratio of the pixel outputs of two non-affected pixels of second and third colors. The non-affected pixels may be at least one pixel away from the AF pixel in the pixel array. In some cases, the non-affected pixel 720 is adjacent to one of the adjacent pixels and not adjacent to the AF pixel 702.

For example, the pixels 712, 714 are adjacent to the AF pixel 702 and may be affected by the shielding element 706 in the AF pixel 702. The relationship between a ratio of the two affected pixels 712, 714 and a ratio of two non-affected pixels can be used to correct the output of the affected pixel 712 and/or the affected pixel 714. The ratio of the pixel outputs of two non-affected pixels, such as pixels 716 and 718, can be used to correct the pixel output of pixel 712 and/or pixel 714. As one example, with a Bayer CFA, the pixels 712 and 714 can be blue pixels and the AF pixel 702 a green pixel. The ratio of the pixel outputs of 716/718, or the ratio of blue pixel 716/green pixel 718 may be used to compensate the pixel output of one or both blue pixels 712, 714.

Similarly, the pixels 708, 710 are adjacent to the AF pixel 704 and may be affected by the shielding element 706 in the AF pixel 704. The relationship between a ratio of the two affected pixels 708, 710 and a ratio of two non-affected pixels can be used to correct the output of the affected pixel 708 and/or the affected pixel 710. The ratio of the pixel outputs of two non-affected pixels, such as pixels 720 and 722, can be used to compensate the pixel output of one or both affected pixels 708, 710. As one example, with the Bayer CFA, the pixels 708, 710 can be red pixels and the AF pixel a green pixel. The ratio of pixels outputs 720/722, or the ratio of red pixel 720/green pixel 722 may be used to compensate the pixel output of the red pixel 708 and/or the red pixel 710.

As shown in FIG. 7, the locations of the AF pixels 702, 704 may vary within the pixel array of the image sensor 700. The AF pixels 702, 704 can be adjacent to each other or not adjacent to each other (e.g., separated from each other by one or more pixels horizontally and/or vertically). In some cases, the AF pixels 702, 704 are located in the same row or in the same column of the pixel array. The AF pixels may be distributed relatively evenly within the pixel array. Alternatively, the AF pixels may be concentrated in one or more regions of the pixel array and/or distributed unevenly within the pixel array.

Additionally, the locations of the non-affected pixels can also vary within the pixel array. The non-affected pixels 716, 718, 720, 722 can be adjacent to each other or not adjacent to each other (e.g., separated from each other by one or more pixels horizontally and/or vertically). In some cases, the non-affected pixels can be located in the same row or in the same column of the pixel array.

Figure 8:
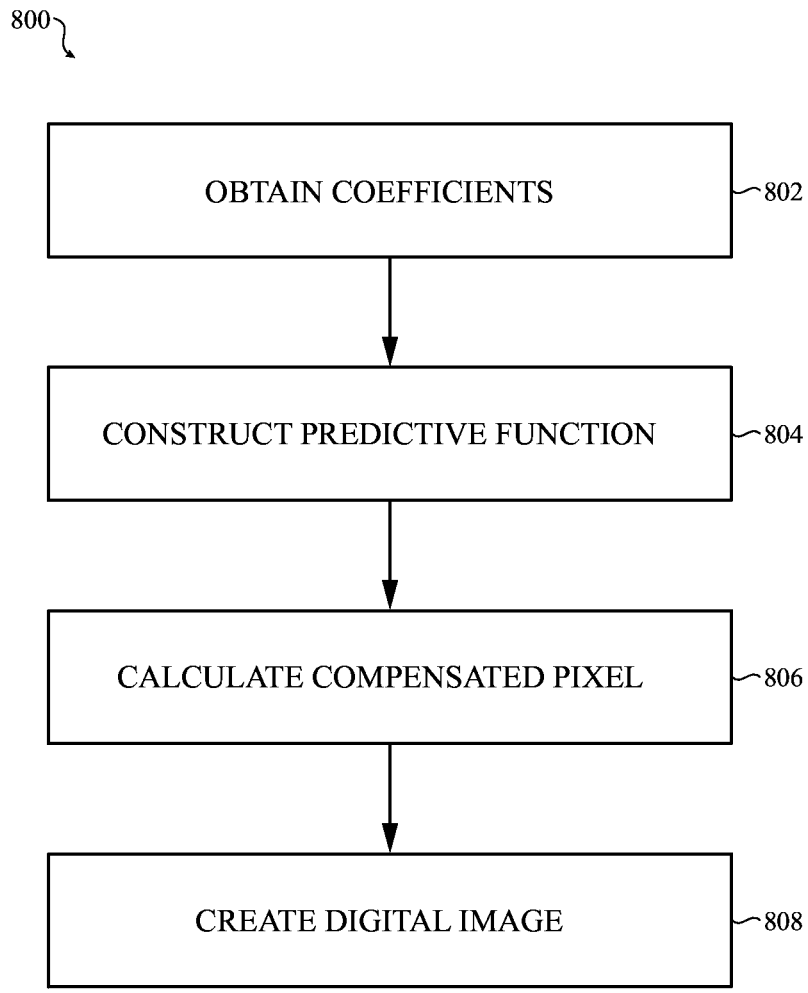
FIGS. 8-9 depict example processes for creating a digital image.

FIG. 8 depicts a flow chart of an example process for creating a digital image that has been compensated. In the present example, process 800 is used to create a digital image that is compensated for the presence of elements that interfere with the light incident on the pixels of the image sensor. In particular, the digital image is compensated to reduce the effects of shielding elements integrated into the array of pixels of the image sensor. While the example process 800 is described with respect to an image sensor having shielding elements, the process may also be applied to an image sensor that includes other types of elements that are integrated into the image sensor.

In operation 802, a set of coefficients are obtained. In the present example, the coefficients represent the amount of cross-talk artifacts in a pixel adjacent to an AF pixel in the image sensor array. In particular, the coefficients represent the relative increase or decrease in light received by an adjacent pixel due to the presence of a shielding element in the AF pixel. In some cases, a shielding element may block some of the light that would normally be incident to a pixel that is adjacent to an AF pixel. In other cases, a shielding element increases the light received by a pixel that is adjacent to an AF pixel. For example, the shielding element in an AF pixel may reflect light back onto an optical element, such as a microlens, which in turn reflects the light back onto a pixel adjacent to the AF pixel. The coefficients obtained in operation 802 can describe the relationship between the affected adjacent pixel(s) relative to the ratio of two non-affected pixels. With reference to FIG. 7, the coefficients may correspond to the ratio of non-affected pixel values 716, 718 or 720, 722 that are all located at least one pixel away from an affected pixel 702 or 704. In one example, one or more sets of coefficients may be obtained in operation 802.

With respect to operation 802, the set of coefficients may be obtained, for example, using a calibration operation. For example, the image sensor may be subjected to a known or predictable lighting condition and the pixel data may be collected and stored. The coefficients may be obtained by, for example, comparing the output of pixel values (the affected pixels) that are adjacent or neighboring to AF pixels to another reference pixel. In one case, the reference pixel is the AF pixel. In another case, the reference pixel may be another pixel that is not adjacent to the AF pixel (e.g., an unaffected pixel). The relative difference between the affected pixel values and the reference pixel values may be used to determine the coefficients of operation 802. An example calibration operation is described below with respect to FIG. 10.

In operation 804, a predictive function is constructed. In this example, a predictive function is constructed based on the set of coefficients obtained in operation 802. As described in more detail below with respect to operation 806, the use of a predictive function facilitates the compensation of a large number of pixels in an image sensor without consuming excessive amounts of computer memory resources. In some cases, the use of a predictive function eliminates the need to permanently store the set of coefficients obtained in operation 802.

With respect to operation 804, the predictive function may be constructed as an n-th order polynomial function. For example, a 6th order polynomial may be constructed based on the coefficients obtained in operation 802. In general, the set of coefficient values correspond to a spatial distribution in accordance with the location of the corresponding pixels in the array. A polynomial function can be fit to the coefficient data with respect to the spatial distribution along one or more axis or directions. In one example, the 6th order polynomial equation can be constructed by fitting the polynomial equation to the plot of coefficient values along an X or Y-axis of the image sensor. The polynomial equation may be created using a traditional polynomial regression technique for fitting a polynomial to a set of data. Other techniques, including linear regression, non-parametric regression, spline fitting, and other techniques may also be used to construct the predictive function for operation 806. In this example, the predictive function is an nth order polynomial. However, the predictive function may also be, for example, a linear function, spline, or other parametric expression.

In the present example, the 6th order polynomial may be expressed as 6 polynomial coefficients (A-G) of a 6th order polynomial equation. The polynomial coefficients may be obtained using the coefficients obtained in operation 802 and by using a polynomial regression technique. These coefficient values of the predictive function can change due to the color temperature. These values can also be different if the size of the pixels used in the pixel array is changed. In some cases, the values of the polynomial coefficients may range from $+/-10^{-15}$ to $+/-10^{2}$.

Accordingly, the predictive function (6th order polynomial) may be expressed as:

$$Y=Ax^6+Bx^5+Cx^4+Dx^3+Ex^2+Fx+G, \quad \text{(Equation 1)}$$

where x is the ratio of two non-affected pixels along the horizontal x-axis and Y is the approximated value of the ratio of two affected pixels. While this example is directed to fitting a predictive function along the horizontal x-axis, other implementations may construct the predictive function along a different direction. Additionally, a multi-dimensional predictive function could also be constructed using the coefficients in operation 802.

With respect to operation 804, the predictive function may only need to be fit along one direction to sufficiently predict the cross-talk artifacts for a set of pixels. For example, the coefficient data may be substantially consistent along a first axis and vary according to the predictive function along a second axis that is transverse to the first axis. Alternatively, a two-dimensional predictive function can be used to predict the cross-talk artifacts for a set of pixels.

In operation 806, a compensated pixel value is calculated using the predictive function. In some implementations, operation 806 is performed after a set of pixel data is acquired by the image sensor. For example, operation 806 may be performed after the image sensor has acquired pixel data as part of a camera image capture operation. Similarly, operation 806 may be performed after pixel data has been acquired as part of a video sequence capture operation. Alternatively, operation 806 may be performed on pixel data that has been stored in computer memory.

In operation 806, a compensated pixel value may be calculated by using the predictive function to estimate the effect on the pixel due to any neighboring shielding elements (or other types of elements within the pixel array). In some cases, the compensated pixel value is an approximation of the pixel value had there been no shielding element present to interfere with the light received by the (affected) pixel.

In one embodiment, the locations of the affected pixels immediately adjacent to the shielding elements (e.g., pixels 708 and 714) in the pixel array may be mapped and separated into respective color planes or channels. The pixel values of the non-affected pixels in the ratio can then be determined. For example, with respect to affected pixel 708, the pixel values of the non-affected pixels 720 and 722 may be determined. The polynomial may then be used to predict the correct output of the pixel 708.

In operation 808, a digital image is created based on the compensated pixel value. In one example, a digital image is created using the compensated pixel value along with other pixel values obtained using the image sensor. That is, the compensated pixel value is used to create a portion of a digital image, such as an image pixel. In some cases, the compensated pixel corresponds directly with an image pixel, although it is not necessary that it correspond one-to-one. In one example, the compensated pixel corresponds to a red/blue/green pixel region on the image sensor. The compensated pixel value may be combined with other red/blue/green pixel regions to compute a single image pixel in the digital image.

In one example implementation, many compensated pixel values are computed and the many computed pixels values are used to create the digital image. In one embodiment, the number of compensated pixels can be approximately proportional to the number of shielding elements integrated into the image sensor. By creating a digital image using compensated pixel values, a digital image may more accurately portray the lighting conditions and the color of the scene that has been photographed. In particular, the digital image produced using the process shown in FIG. 8 can exhibit reduced or minimal effects due to shielding elements.

With regard to operation 808, the digital image may be created in accordance with any one of a number of known digital image formats. For example, the digital image may be formed as a Joint Photographic Experts Group (JPG), Graphical Image File (GIF), Tagged Image File Format) (TIFF), Portable Network Graphics (PNG), or RAW image format. The digital image may be stored in a memory, including, for example, memory 202 in FIG. 2.

In some implementations, process 800 may be performed for each digital image that is created using a digital camera. In some implementations, process 800 is performed for multiple digital images that are used to create a video sequence or series of images. Some of the operations of process 800 may be implemented in hardware and some operations may be implemented in a combination of hardware and computer-readable instructions executed on a computer processor.

Figure 9:
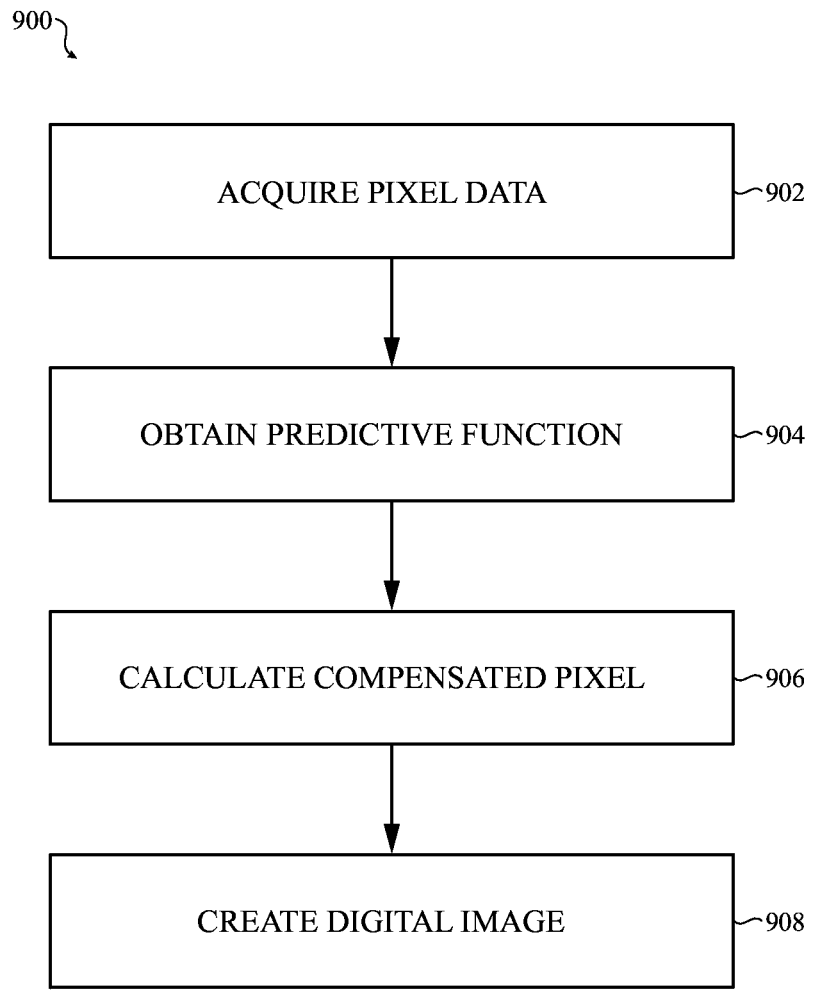

FIG. 9 depicts a flow chart of another example process for creating a digital image that has been compensated. In the present example, process 900 is used to create a digital image that is compensated for the presence of shielding elements within the image sensor array. In other examples, process 900 can be used to create a digital image that is compensated for other types of elements that are integrated with the image sensor of a digital camera.

In operation 902, pixel data is acquired using the image sensor. In one example, the sensor values for the pixels are acquired using a pixel scanning technique. An example configuration for performing a pixel scan is described above with respect to FIG. 4. In some implementations, operation 902 is performed as part of a digital camera photograph capture operation. For example, the pixel data may be acquired in response to a capture image command provided by a user input to the device. In other implementations, the pixel data is acquired at an interval as part of a video sequence or series of digital images.

In operation 904, a predictive function is obtained. As discussed above with respect to FIG. 8, the predictive function may approximate the effect of the presence of auto-focus shielding elements on neighboring pixels in the image sensor. As described previously, use of a predictive function may facilitate image compensation without requiring voluminous computer storage. In particular, one or more predictive functions can be used to approximate a large number of coefficient values obtained in a calibration operation.

The predictive function may be obtained, for example, by a previously performed calibration operation or other function generation operation. For example, the predictive function may be obtained from computer memory having been previously created in accordance with operation 804 in FIG. 8. As discussed previously, the predictive function may be an nth order polynomial function, a linear function, spline, or other parametric expression.

In operation 906, a compensated pixel value is determined or predicted using the predictive function. The compensated pixel value may be calculated using, for example, the techniques described above with respect to operation 806. Specifically, the compensated pixel value may be computed using Equation 1 described above.

In operation 908, a digital image is created based on the compensated pixel. In particular, the compensated pixel may be used to create a digital image that has been compensated to reduce the effects of elements integrated in the image sensor. In this example, the digital image is compensated to reduce the effects of the shielding elements integrated into the image sensor. An example of operation 908 is provided above with respect to operation 808 of FIG. 8.

Figure 10:
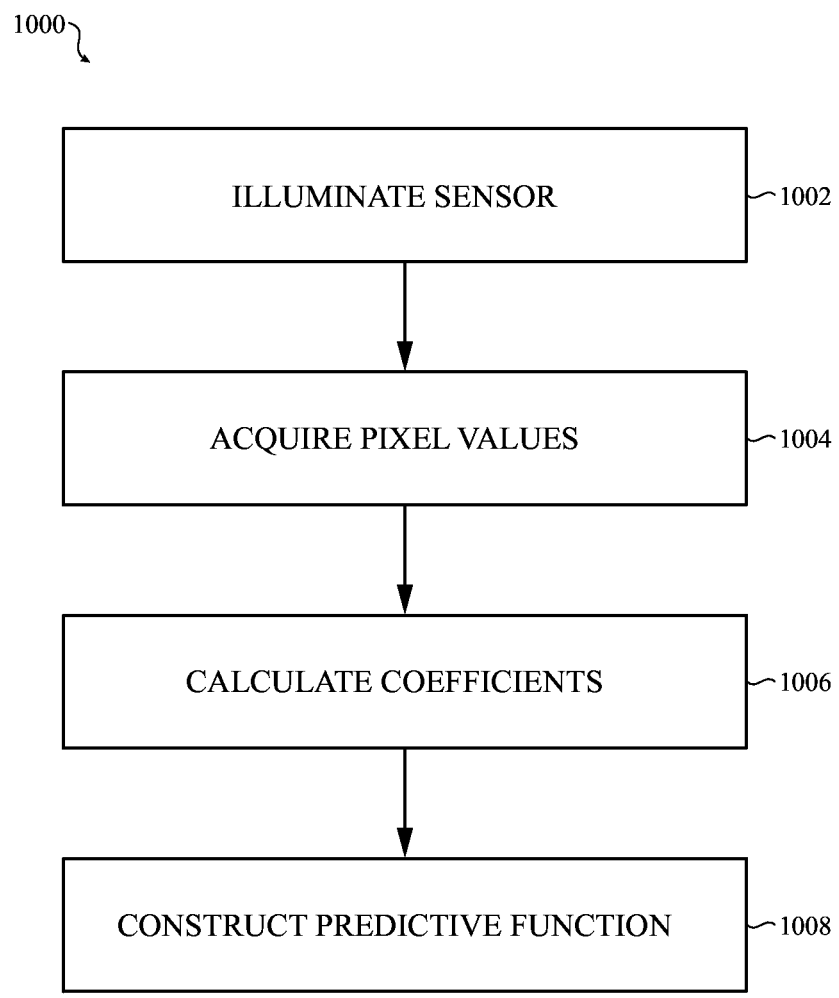
FIG. 10 illustrates an example process for calibrating an image sensor.

FIG. 10 depicts a flow chart of an example process for calibrating an image sensor. Process 1000 may be used, for example, to produce the coefficients obtained in operation 802 and/or construct the predictive function in operation 804 in FIG. 8. As discussed earlier, the coefficients and/or predictive function can be used to estimate and compensate for pixel cross-talk artifacts in the pixel array of the image sensor. In particular, the predictive function can be used to compensate for the optical effects of elements, such as the shielding elements, integrated in an image sensor.

In operation 1002, the image sensor is illuminated. To generate an accurate calibration of the response of the sensor pixels, it may be advantageous that the illumination be substantially repeatable. In this example, the image sensor is illuminated with a light source having a known color and brightness. The light source is also provided as a surface light source to minimize localized regions of brightness or color variation.

In operation 1004, the pixel values are acquired. In this example, a scan of the pixel array is performed to obtain the sensor measurements for each of the active pixels in the array. An example scan is discussed above with respect to FIG. 4. In some cases, multiple scans are performed and the pixel measurements are averaged to obtain a single set of pixel values. In one example, the pixel values may be stored in an image file format (e.g., RAW or TIFF file format) or other digital file. In some cases, the pixel values are stored only temporarily in computer memory for purposes of performing the operations of process 1000.

In operation 1006, a coefficient is calculated based on the pixel values. In particular, a set of coefficients that represent the relationship between a ratio of two affected adjacent pixels and a ratio of two non-affected pixels is determined. The calculation of the coefficients for operation 1006 is substantially similar to operation 802 discussed above with respect to FIG. 8.

In operation 1008, a predictive function is constructed based on the set of coefficients. As previously discussed, the predictive function may be a polynomial curve, linear fit, or other type of parametric representation of the set of coefficients. A description of the construction of a predictive function is provided above with respect to operation 804 of FIG. 8.

The processes shown in FIGS. 8-10 are typically implemented as one or more sets of computer-readable instructions stored on a non-transitory computer readable storage medium. The operations shown in FIGS. 8-10 may be performed by executing the one or more sets of computer-readable instructions on a computer processor. An example memory and processor that can be used to perform the methods of FIGS. 8-10 are described above with respect to FIG. 2.

Even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

We claim:

1. A computer-implemented method for producing a digital image using an image sensor comprised of a pixel array, the pixel array comprising pixels affected by at least one shielding element in the pixel array and pixels not affected by the at least one shielding element, the method comprising:
   obtaining a plurality of coefficients representing a relative measurement between a ratio of two of the affected pixels and a ratio of two of the non-affected pixels;
   constructing a predictive function based on the plurality of coefficients;
   computing a compensated pixel value for at least one pixel of the image sensor using the predictive function; and
   creating a digital image based in part on the compensated value.

2. The computer-implemented method of claim 1, wherein the two affected pixels are located adjacent to an auto-focus pixel that is at least partially shielded from light by a shielding element.

3. The computer-implemented method of claim 1, wherein the two affected pixels are associated with one color and one non-affected pixel is associated with the one color and the other non-affected pixel is associated with another color.

4. The computer-implemented method of claim 3, wherein the other color associated with the other non-affected pixel is a color associated with an auto-focus pixel that is at least partially shielded from light by a shielding element.

5. The computer-implemented method of claim 4, wherein the two non-affected pixels are not adjacent to an auto-focus pixel that is at least partially shielded from light by a shielding element.

6. The computer-implemented method of claim 1, wherein the predictive function is a polynomial function.

7. The computer-implemented method of claim 1, wherein the predictive function is a sixth-order polynomial function.

8. The computer-implemented method of claim 1, wherein the predictive function is constructed by performing a non-linear regression on at least part of the plurality of coefficients.

9. The computer-implemented method of claim 1, further comprising:
   dividing the pixels into a matrix of grid elements, wherein each grid element represents a specified number of pixels that are adjacent to each other in the pixel array; and
   computing the compensated pixel value for at least one pixel in the matrix of grid elements using the predictive function.

10. The computer-implemented method of claim 9, wherein each grid element of the matrix of grid elements represents a 16 by 16 group of adjacent pixels.

11. A computer-implemented method for producing a digital image using an image sensor comprised of a pixel array, the pixel array comprising pixels affected by at least one shielding element in the pixel array and pixels not affected by the at least one shielding element, the method comprising:
   obtaining a plurality of coefficients representing a relative measurement between a ratio of two of the affected pixels and a ratio of two of the non-affected pixels;
   computing a compensated pixel value for at least one pixel of the image sensor using at least one coefficient; and
   creating a digital image based in part on the compensated value.

12. The computer-implemented method of claim 11, wherein the at least one pixel is located adjacent to an auto-focus pixel that is at least partially shielded from light by a shielding element.

13. The computer-implemented method of claim 11, wherein the two affected pixels are associated with one color and one non-affected pixel is associated with the one color and the other non-affected pixel is associated with another color.

14. The computer-implemented method of claim 13, wherein the other color associated with the other non-affected pixel is a color associated with an auto-focus pixel that is at least partially shielded from light by a shielding element.

15. The computer-implemented method of claim 13, wherein the two non-affected pixels are not adjacent to an auto-focus pixel that is at least partially shielded from light by a shielding element.

16. An electronic device, comprising:
   an image sensor that includes a pixel array, wherein one or more pixels in the pixel array is configured as an auto-focus pixel that is at least partially shielded from light by a shielding element;
   a memory having computer-readable instructions stored thereon; and
   a processor configured to produce a digital image by executing the computer-readable instructions, the instructions for:
   obtaining a plurality of coefficients representing a relative measurement between a ratio of two pixels affected by the shielding element and a ratio of two pixels not affected by the shielding element;
   constructing a predictive function based on the plurality of coefficients;
   computing a compensated pixel value for at least one pixel of the image sensor using the predictive function; and
   creating a digital image based in part on the compensated value.

17. The electronic device of claim 16, wherein the two affected pixels are located adjacent to an auto-focus pixel.

18. The electronic device of claim 16, wherein a color associated with at least one of the non-affected pixels is a color associated with an auto-focus pixel.

19. A method for calibrating an image sensor to compensate for one or more optical effects of shielding elements integrated into a pixel array of the image sensor, the pixel array comprising pixels affected by the shielding elements and pixels not affected by the shielding elements, the method comprising:
   illuminating the image sensor using a light source;
   acquiring pixel data for the pixel array of the image sensor;
   based on the pixel data, determining a plurality of coefficients that represent a relative measurement between a ratio of pixels affected by the shielding elements and a ratio of pixels not affected by the shielding elements in the pixel array;
   constructing a predictive function based on the plurality of coefficients, the predictive function configured to compensate for the one or more optical effects of the shielding elements; and
   storing the predictive function in memory.

20. The computer-implemented method of claim 19, wherein the affected pixels are adjacent to an auto-focus pixel that is at least partially shielded from light by a shield element and the non-affected pixels are not adjacent to the auto-focus pixel.

* * * * *